United States Patent
Hulfachor et al.

(10) Patent No.: US 7,348,818 B2
(45) Date of Patent: Mar. 25, 2008

(54) TUNABLE HIGH-SPEED FREQUENCY DIVIDER

(75) Inventors: Ronald B. Hulfachor, Nashua, NH (US); Ligang Zhang, Oceanside, CA (US)

(73) Assignee: Silicon Laboratories Inc., Austin, TX (US)

( * ) Notice: Subject to any disclaimer, the term of this patent is extended or adjusted under 35 U.S.C. 154(b) by 56 days.

(21) Appl. No.: 11/170,933

(22) Filed: Jun. 30, 2005

(65) Prior Publication Data

US 2007/0001719 A1    Jan. 4, 2007

(51) Int. Cl.
   *H03L 7/06* (2006.01)
(52) U.S. Cl. ....................... 327/156; 327/147
(58) Field of Classification Search ........... 327/113, 327/115, 117, 122, 147–148, 156, 157
   See application file for complete search history.

(56) References Cited

U.S. PATENT DOCUMENTS

| | | | |
|---|---|---|---|
| 4,730,349 A * | 3/1988 | Wilhelm et al. | 377/47 |
| 5,430,336 A * | 7/1995 | Katakura | 326/126 |
| 5,945,858 A * | 8/1999 | Sato | 327/202 |
| 6,285,262 B1 * | 9/2001 | Kuriyama | 331/25 |
| 6,522,711 B2 * | 2/2003 | Wakada et al. | 377/48 |
| 6,545,517 B2 * | 4/2003 | Asam | 327/115 |
| 6,597,212 B1 * | 7/2003 | Wang et al. | 327/117 |
| 7,109,764 B2 * | 9/2006 | Sakamoto et al. | 327/156 |
| 2005/0248410 A1 * | 11/2005 | Su | 331/16 |

FOREIGN PATENT DOCUMENTS

JP    406197011    * 7/1994

OTHER PUBLICATIONS

Rategh, Hamid R., and Lee, Thomas H., "Superharmonic Injection Locked Oscillators as Low Power Frequency Dividers", Center for Integrated Systems, Stanford University, <downloaded from http://www-smirc.stanford.edu/%7Ehamid/papers/vlsi98s-Hamid.pdf on Jul. 29, 2005> 21 pages.

Rategh, Hamid R. and Lee, Thomas H., "Superharmonic Injection Locked Oscillators as Low Power Frequency Dividers", Symp. VLSI Circuits Dig. Tech. Papers, Jun. 1998, pp. 4 pages.

Razavi, Behzad et al., "Design of High-Speed, Low-Power Frequency Dividers and Phase-Locked Loops in Deep Submicron CMOS", IEEE Journal of Solid-State Circuits, vol. 30, No. 2, Feb. 1995, pp. 101-109.

(Continued)

*Primary Examiner*—Dinh T. Le
(74) *Attorney, Agent, or Firm*—Zangorin O'Brien Graham LLP (57) ABSTRACT

A locking range of a current mode logic (CML) frequency divider circuit is tunable by dynamically adjusting a tail current of the frequency divider circuit according to a control signal. The control signal may be based on at least one control signal coupled to tune a controllable oscillator. The control signal may be based on a frequency of an output of a voltage controlled oscillator coupled to the frequency divider. The control signal may be based on the voltage swing of an output of a voltage controlled oscillator coupled to the frequency divider. The control signal may be based on an output of the frequency divider circuit.

25 Claims, 7 Drawing Sheets

OTHER PUBLICATIONS

Razavi, Behzad, "A Study of Injection Locking and Pulling in Oscillators", IEEE Journal of Solid-State Circuits, vol. 39, No. 9, Sep. 2004, pp. 1415-1424.

Rategh, Hamid R. et al., "A CMOS Frequency Synthesizer with an Injection-Locked Frequency Divider for a 5-GHz Wirless LAN Receiver", IEEE Journal on Solid-State Circuits, vol. 35, No. 5, May 2000, pp. 780-787.

Rategh, Hamid R. and Lee, Thomas H., "Superharmonic Injection-Locked Frequency Dividers", IEEE Journal of Solid-State Circuits, vol. 34, No. 6, Jun. 1999, pp. 813-821.

Lee, JRI and Razavi, Behzad, "A 40-GHz Frequency Divider in 0.18-µm CMOS Technology", IEEE Journal of Solid-State Circuits, vol. 39, No. 4, Apr. 2004, pp. 594-601.

Betancourt-Zamora, Rafael J. et al., "1-GHz and 2.8-GHz CMOS Injection-locked Ring Oscillator Prescalers", Allen Center for Integrated Systems, Stanford University, <downloaded from http://smirc.stanford.edu/papers/VLSI01p-raf.pdf on Jul. 29, 2005>, 4 pages.

Heydari, Payam and Mohanavelu, Ravindran, "Design of Ultrahigh-Speed Low-Voltage CMOS CML Buffers and Latches", IEEE Transactions on Very Large Scale Integration (VLSI) Systems, vol. 12, No. 10, Oct. 2004, pp. 1081-1093.

Fang, Wen et al., "An Analytical Maximum Toggle Frequency Expression and Its Application to Optimizing High-Speed ECL Frequency Dividers", IEEE Journal of Solid-State Circuits, vol. 25, No. 4, Aug. 1990, pp. 920-931.

Fei, Louis Fan, "Frequency divider design strategies", <downloaded from http://rfdesign.com/mag/503rfdfl.pdf on Jul. 29, 2005>, Mar. 2005, 4 pages.

Heydari, Payam, "Design Issues in Low-Voltage High-Speed Current-Mode Logic Buffers", Department of Electrical Engineering and Computer Science, <downloaded from http://newport.eecs.uci.edu/~payam/S2-2-heydari.pdf on Jul. 29, 2005>, pp. 21-26.

Mohanavelu, Ravindran and Heydari, Payam, "A Novel Ultra High-Speed Flip-Flop-Based Frequency Divider", <downloaded from http://newport.eecs.uci.edu/~payam/FF_Divider_ISCAS04.pdf on Jul. 29, 2005>, 4 pages.

Singh, Ullas and Green, Michael, "Dynamics of High-Frequency CMOS Dividers", Circuits and Systems, 2002, IEEE International Symposium, vol. 5, pp. V-421 through V-424.

* cited by examiner

| Frequency (GHz) | Nominal Tail Current Vmin (mV) | Enhanced Tail Current Vmin (mV) |
|---|---|---|
| 8.3 | 0 (natural frequency) | |
| 8.7 | | 0 (natural frequency) |
| 9.0 | 42 | 15 |
| 10.0 | 71 | 48 |
| 11.0 | 113 | 79 |
| 12.0 | 182 | 121 |
| 13.0 | 284 | 198 |

TUNABLE HIGH-SPEED FREQUENCY DIVIDER

BACKGROUND

1. Field of the Invention

This invention relates to frequency divider circuits and particularly to high-speed frequency divider circuits.

2. Description of the Related Art

An exemplary phase-locked loop (PLL) (e.g., PLL 100 of FIG. 1) includes a frequency divider (e.g., frequency divider circuit 110) to divide down an output of a voltage controlled oscillator (e.g., VCO 108). For example, a divide-by-two circuit (e.g., frequency divider 200 of FIG. 2) includes a master-slave flip-flop with two D-latches in cascade and in a feedback configuration. The output of frequency divider 200 toggles after each input clock cycle, producing an output signal that toggles at a rate half of the rate of the input clock signal.

Figure 2:
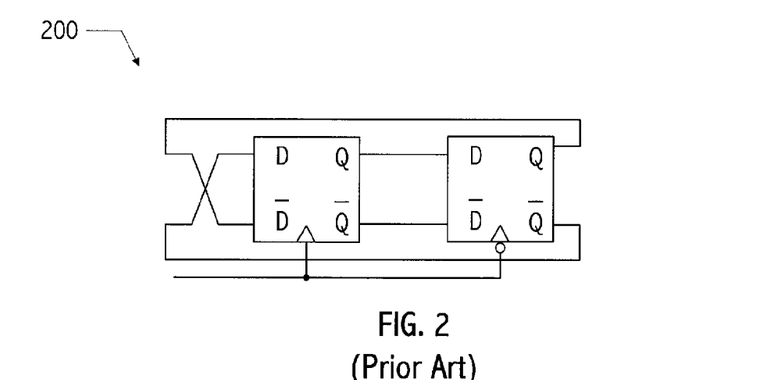
FIG. 2 is a block diagram illustrating a latch-based frequency divider circuit.

Frequency divider circuit 200 may be implemented using current mode logic (CML) blocks having a differential architecture biased by a substantially input independent tail current. A typical CML frequency divider (e.g., frequency divider 300 of FIG. 3) couples master latch 302 to slave latch 304. During a track mode, the tail current flows through devices 308 and during a latch mode, the tail current flows through devices 310. The devices of frequency divider 300 are sized such that in operation, frequency divider 300 self-oscillates with a natural frequency of oscillation (i.e., frequency divider 300 produces an output clock having the natural frequency when an input full-rate clock has a differential signal voltage of zero). The divider natural frequency of oscillation is a function of load resistor value ($R_L$), latch small-signal transconductance ($g_m$) value, and gate and wire capacitance.

Figure 3:
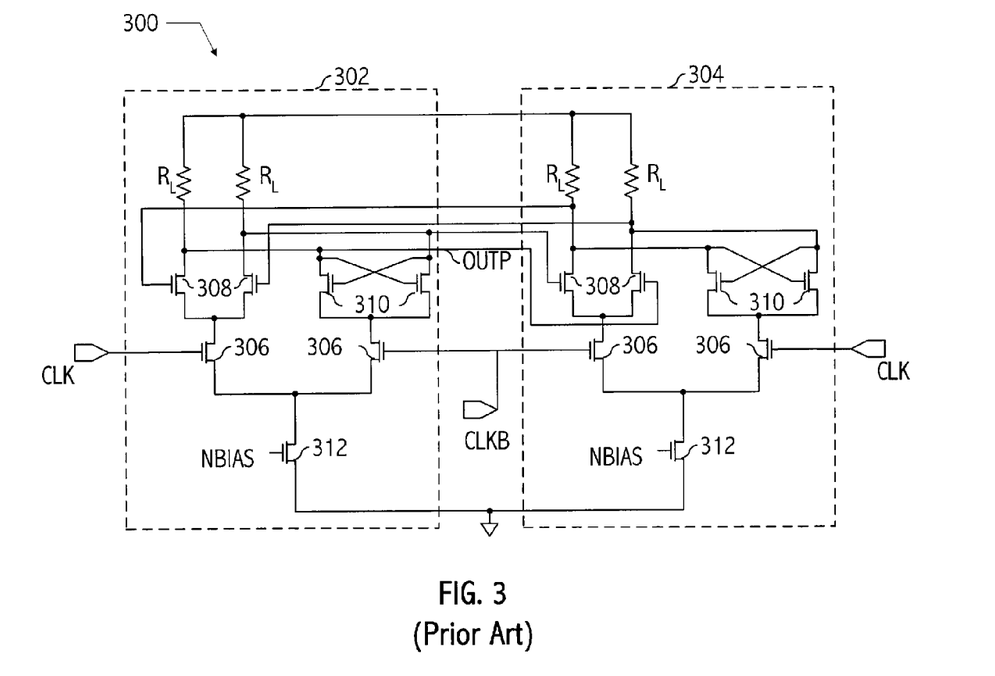
FIG. 3 is a circuit diagram illustrating an exemplary current mode logic (CML) frequency divider circuit.

As the voltage of the input clock differential signal is increased, the frequency divider experiences an "injection locking effect." Due to injection of the full-rate input signal through devices 306, the frequency divider behaves as an oscillator with its output clock frequency pulled from the natural frequency to oscillate at a half-rate frequency of the input clock. Voltage $V_{min}$ is the minimum amplitude of the full-rate input clock signal (CLK minus CLKB) for which the frequency divider maintains lock, i.e., outputs a half-rate frequency signal for a particular full-rate input clock signal. In general, $V_{min}$ increases with increases in the deviation of the frequency of the full-rate input signal from twice the value of the divider natural frequency. The greater the full-rate input signal voltage, the farther away it can pull the frequency of the output signal of the divider from the natural frequency.

Figure 1:
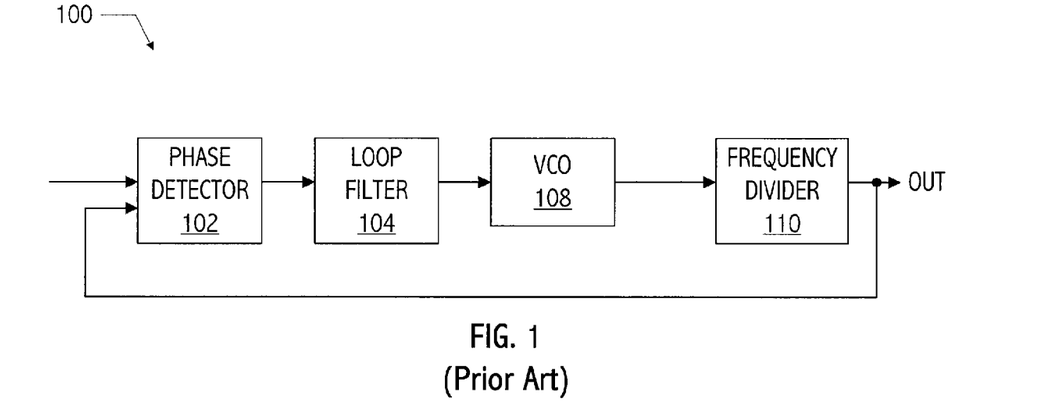
FIG. 1 is a block diagram illustrating an exemplary phase-locked loop (PLL) circuit comprising a frequency divider circuit.

As the VCO frequency of oscillation rises, parasitic capacitance and resistance may reduce signal swing at the inputs of the frequency divider. For example, the output voltage swing of VCO 108 may be less than $V_{min}$, preventing the frequency divider circuit from locking to the half-rate signal. Accordingly, improved techniques for dividing the frequency of an input clock signal are desired.

SUMMARY

A locking range of a current mode logic (CML) frequency divider circuit is tunable by dynamically adjusting a tail current of the frequency divider circuit according to a control signal. In at least one embodiment of the invention, the control signal is based on at least one control signal coupled to tune a controllable oscillator. In at least one embodiment of the invention, the control signal is based on a frequency of an output of a voltage controlled oscillator coupled to the frequency divider. In at least one embodiment of the invention, the control signal is based on the voltage swing of an output of a voltage controlled oscillator coupled to the frequency divider. In at least one embodiment of the invention, the control signal is based on an output of the frequency divider circuit.

In at least one embodiment of the invention, a differential divider circuit includes at least one common node coupled to at least one tail current path in the differential divider circuit. The differential divider circuit includes at least one differential pair of devices coupled to receive a differential input signal and coupled to the common node. The tail current path is coupled to the common node to selectively increase a tail current through the common node according to a control signal. The tail current adjusts a natural frequency of oscillation of the differential divider circuit. In at least one embodiment of the invention, a method includes selectively adjusting at least one tail current of a frequency divider circuit according to a control signal, thereby adjusting the locking range of the frequency divider circuit.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

In an exemplary PLL, a frequency divider circuit is designed to have a natural frequency and locking range sufficient to lock to a particular range of half-rate frequencies based on a range of full-rate frequency signals that may be output from a voltage controlled oscillator (VCO). As the PLL acquires lock to an input signal, the VCO output may overshoot twice the natural frequency of the frequency divider circuit. For example, as the PLL including a frequency divider with a natural frequency of approximately 5 GHz acquires lock to a 10.5 GHz input, the VCO output may overshoot 10.5 GHz and provide approximately a 12 GHz output signal to the frequency divider. For proper operation, the frequency divider is expected to divide the 12 GHz full-rate signal down to a 6 GHz half-rate signal. However, at this higher full-rate frequency, $V_{min}$ is greater than $V_{min}$ for full-rate input frequencies corresponding to half-rate frequencies that are closer to the natural frequency. In addition, parasitic capacitance and resistance may reduce the output voltage swing of the VCO such that the output of the VCO is insufficient to lock the frequency divider circuit to the half-rate signal (i.e., the VCO output may be less than $V_{min}$).

In general, tuning the natural frequency of the frequency divider circuit by modifying circuitry associated with high-speed nodes of the frequency divider circuit adds signal path parasitics that may reduce the maximum natural frequency of the divider. Thus, it may be preferable to tune the frequency divider circuit at low frequency nodes of the frequency divider circuit. For example, the frequency divider circuit may be modified at the low frequency nodes of the tail devices. A technique for reducing frequency divider circuit sensitivity to input signal swing implements a current mirror with an internal, resistor-based tail current source, i.e., the tail current is generated by dropping a known voltage, e.g., a voltage generated by a bandgap voltage reference circuit, across a resistor. An exemplary current mirror is illustrated by current source 430 and device 420 in FIG. 4. When the resistor(s) in the current source have a low effective value in operation (e.g., due to process or temperature variations), the load resistors typically also have low effective values. Although the load resistors have low effective values, the current tail is increased due to the low effective value of resistors in the current source, thus maintaining a substantially constant CML output swing. However, additional techniques may reduce sensitivity of the frequency divider circuit to input voltage swing.

Figure 4:
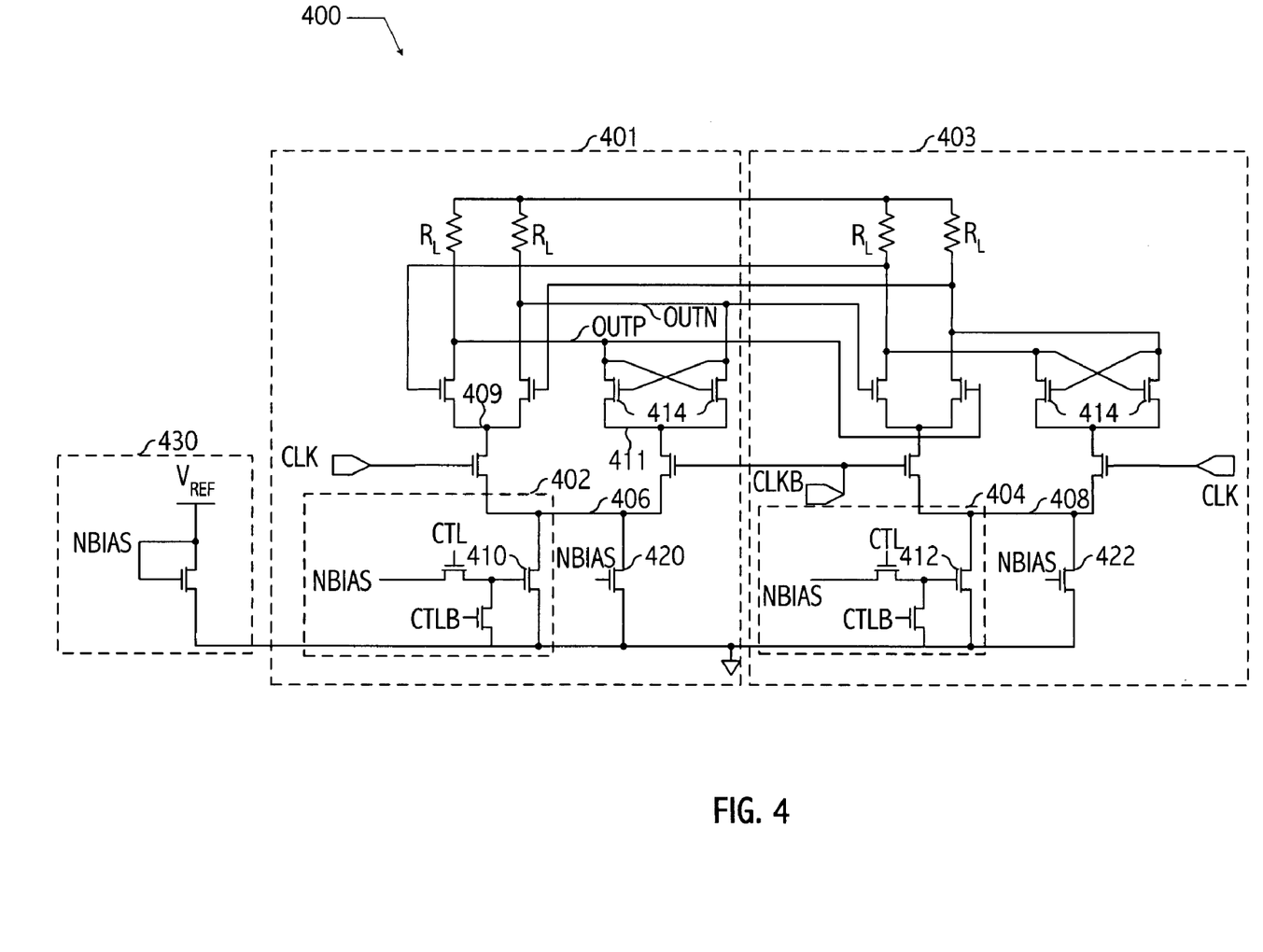
FIG. 4 is a circuit diagram illustrating a frequency divider circuit comprising a selectable tail current path consistent with at least one embodiment of the present invention.

Referring to FIG. 4, exemplary frequency divider circuit 400 achieves a tunable locking range by including selectable tail current blocks 402 and 404 coupled to common nodes 406 and 408, respectively. Devices 410 and 412 may be selectively enabled by control signals CTL and CTLB, to increase the tail currents flowing through respective ones of common nodes 406 and 408 according to the voltage swing of CLK and CLKB. The small signal transconductances ($g_m$s) of latch transistors 414 increase with increases in the tail currents and increase the natural frequency of frequency divider circuit 400, thus increasing the locking range of frequency divider circuit 400. In addition, an increase of the tail current may increase the output voltage swing of frequency divider circuit 400, thus increasing the locking range and performance of subsequent divider circuits coupled to the output of frequency divider circuit 400. In an exemplary frequency divider circuit 400, devices 410 and 412 are sized to double the tail current of the master and slave latches (e.g., latches 401 and 403, respectively) of frequency divider circuit 400. However, devices 410 and 412 may be sized to provide any suitable additional tail current. Although the tail currents received by common nodes 406 and 408 are current mirror biased (e.g., devices 410 and 412 are responsive to CTL and CTLB to receive voltage NBIAS, which is generated by a current source 430), devices 410 and 412 may be controlled by any suitable technique.

Figure 5:
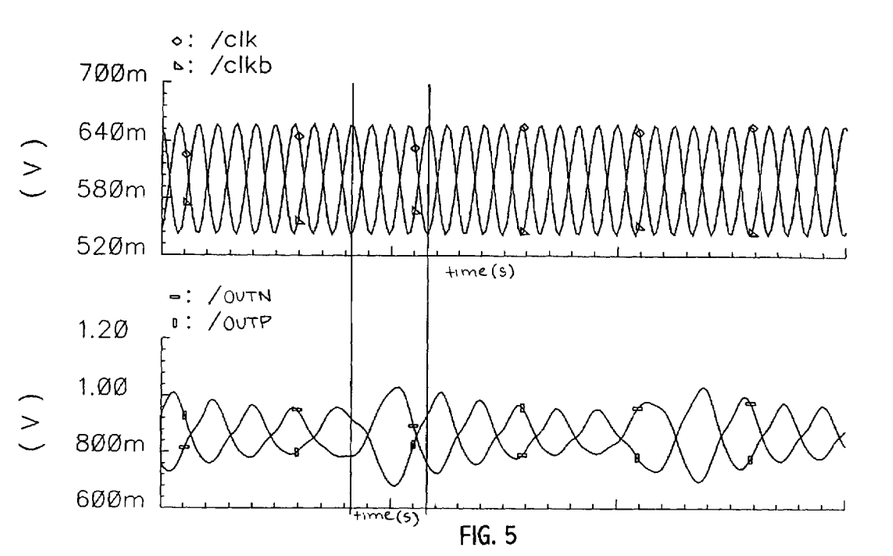
FIG. 5 illustrates exemplary transient responses for nodes of an unlocked frequency divider circuit.
Figure 6:
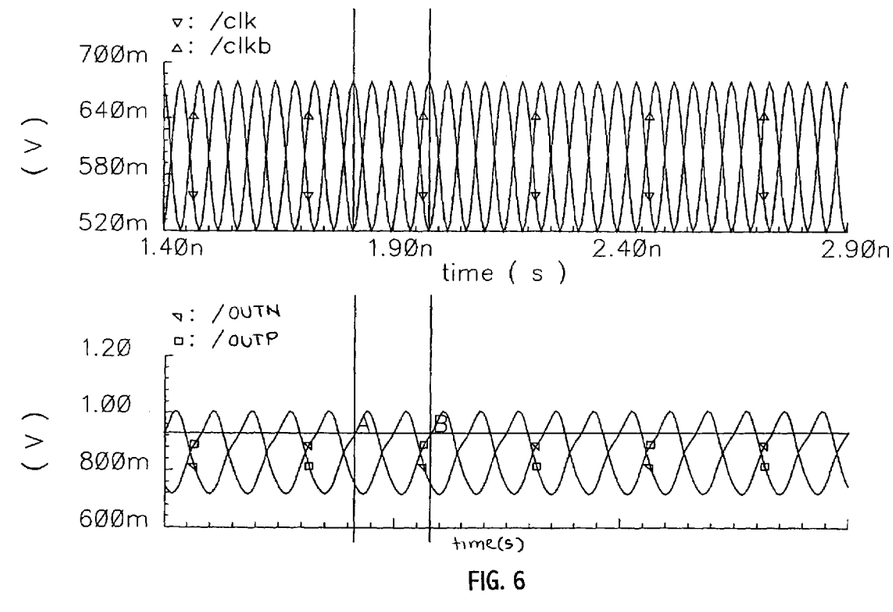
FIG. 6 illustrates exemplary transient responses for nodes of a frequency divider circuit locked to a half-rate frequency.

Transient responses for nodes of an exemplary frequency divider circuit 400 having an exemplary $V_{min}$ of approximately 182 mV are illustrated in FIG. 5 and FIG. 6. CLK and CLKB receive a full-rate input of approximately 12 GHz, having a differential, peak-to-peak voltage of approximately 180 mV. The transient response for frequency divider circuit 400 with the nominal tail current (see FIG. 5) includes tones in the differential output OUTP and OUTN because the full-rate input voltage, which is just below $V_{min}$, and the nominal tail current are insufficient to lock the frequency divider circuit output to the half-rate frequency. FIG. 6 illustrates the transient response for frequency divider circuit 400 when CLK and CLKB receive a full-rate input of approximately 12 GHz, having a differential, peak-to-peak voltage of approximately 250 mV, which is greater than $V_{min}$. The differential output OUTP and OUTN is locked to the half-rate frequency of approximately 6 GHz.

Figure 7A:
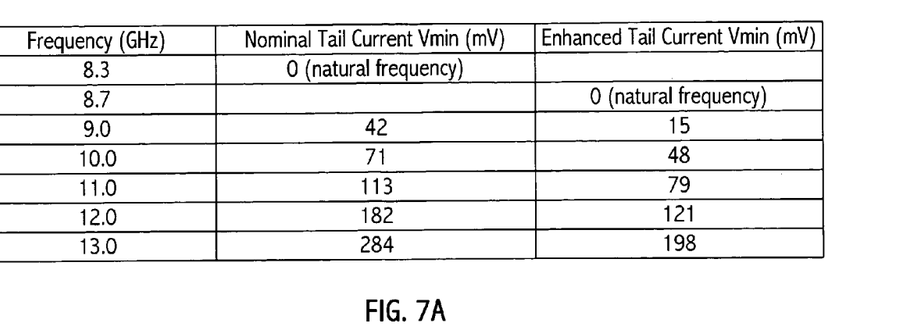
FIG. 7A is a table including exemplary sensitivity data for the CML frequency divider circuit of FIG. 4 consistent with at least one embodiment of the present invention.
Figure 7B:
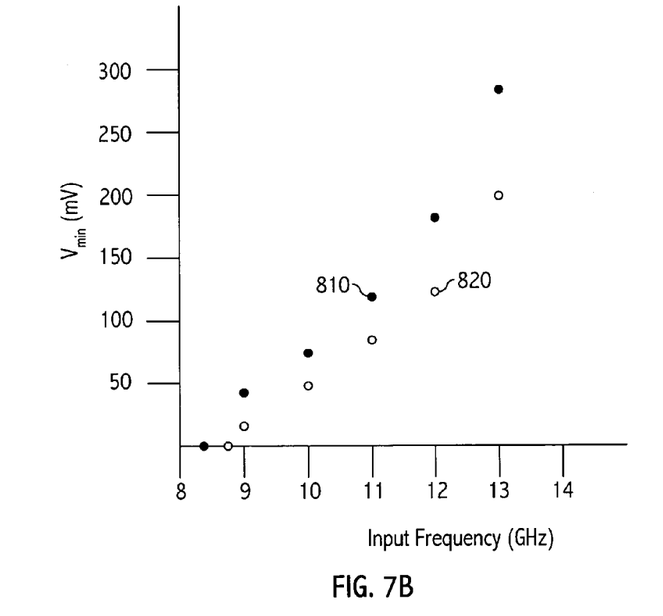
FIG. 7B illustrates exemplary sensitivity curves for the CML frequency divider circuit of FIG. 4 consistent with at least one embodiment of the present invention.

Referring to FIG. 7A and FIG. 7B, $V_{min}$ as a function of full-rate input frequency is illustrated for a nominal tail current (810) and for a tail current increased by 100% (820) for exemplary frequency divider circuit 400. The reduced $V_{min}$ effectively increases the locking range of the exemplary frequency divider circuit at high frequencies. The increased tail current reduces $V_{min}$ by approximately 60 mV for a full-rate input of 12 GHz.

Figure 8:
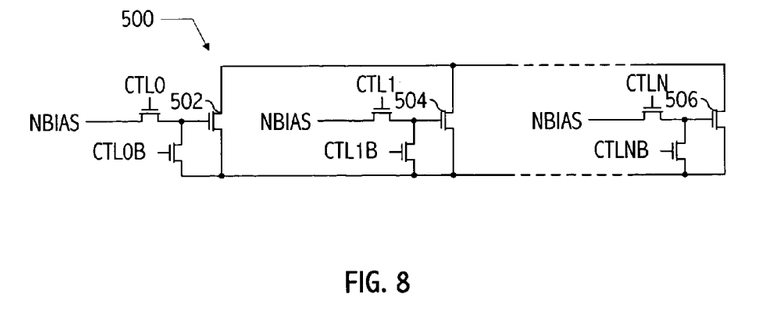
FIG. 8 is a circuit diagram illustrating an n-bit selectable tail current path consistent with at least one embodiment of the present invention.

Referring to FIG. 4 and FIG. 8, selectable tail current blocks 402 and 404 may include exemplary selectable tail current circuit 500. Multiple devices coupled to common nodes 406 and/or 408, may be selectively enabled according to control signals CTL0, CTL1, ... CTLN, and CTL0B, CTL1B, ... CTLNB, corresponding to an n-bit control word. In at least one embodiment, two control bits are decoded to control four devices that are ¼ the size of device 420 or 422, individual ones of the four devices being twice the size of a nominal device. However, the selectable tail current devices can be any suitable combination of device sizes to produce a tail current increased by any suitable amount. For example, the selectable tail current devices may be sized to vary the tail current according to a nonlinear function of the control bits.

In at least one embodiment of the invention, selectable tail current blocks 402 and 404 are independently selectable, i.e., CTL and CTLB of selectable tail current block 402 receives distinct control signals from those received by CTL and CTLB of selectable tail current block 404. In at least one embodiment of the invention, only one of selectable tail current blocks 402 and 404 are included in frequency divider circuit 400. In an exemplary frequency divider circuit, multiple slave latches 403 are coupled to a master latch 401. Master latch 401 alone may include a selectable tail current block coupled to slave latch(es) including only a nominal tail current path.

Dynamic adjustments may reduce frequency divider circuit power consumption as compared to an implementation that does not dynamically adjust a tail current of frequency divider circuit 400. For example, during frequency acquisition of the PLL, the VCO frequency may overshoot the VCO frequency during PLL lock. Dynamic adjustments to a tail current of frequency divider circuit 400 provide an increased tail current to improve frequency divider circuit 400 performance during those periods of frequency acquisition that exceed the nominal VCO frequency. However, when the VCO frequency settles to a nominal frequency, the tail current of frequency divider circuit 400 may be reduced accordingly, thus reducing power consumption of frequency divider circuit 400 as compared to a circuit that provides a fixed tail current that is sufficient for dividing all VCO output frequencies.

Figure 9:
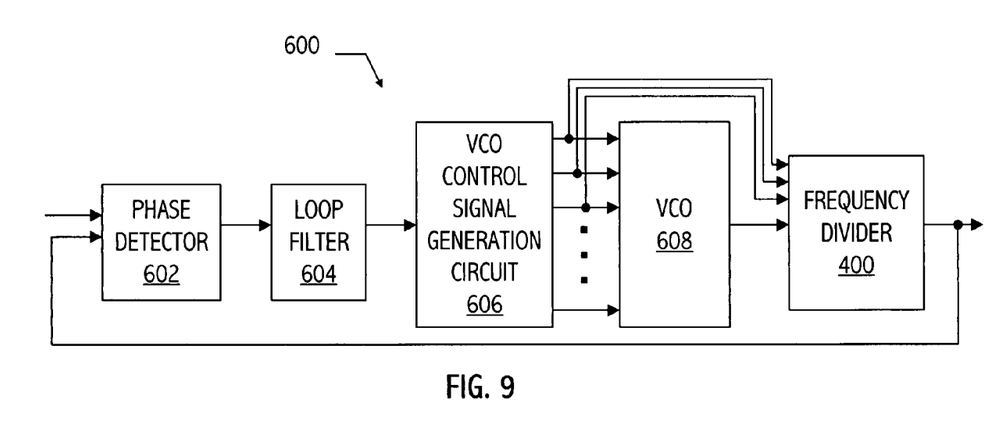
FIG. 9 is a block diagram illustrating a PLL circuit comprising a frequency divider circuit responsive to a VCO control signal generation circuit consistent with at least one embodiment of the present invention.

Referring to FIG. 9, in at least one embodiment of the present invention, a tail current of frequency divider circuit 400 is dynamically adjusted according to adjustments to the VCO output frequency. For example, frequency divider 400 may be coupled to a VCO responsive to multiple control input signals generated by control signal generation circuit 606, e.g., VCO 608. An exemplary VCO and control signal generation circuit are described in U.S. Pat. No. 6,825,785 entitled "Digital Expander Apparatus and Method for Generating Multiple Analog Control Signals Particularly Useful for Controlling a Sub-Varactor Array of a Voltage Controlled Oscillator", issued Nov. 30, 2004, naming Yunteng Huang and Bruno W. Garlepp as inventors, which is hereby incorporated by reference. At least a portion of the VCO control signals provided to VCO 608 to adjust the VCO output frequency may be used to control the frequency divider tail current(s) to adjust the locking range of frequency divider circuit 400. In at least one embodiment of the invention, only the coarse tuning bits of the VCO are used (i.e., one or more most-significant bits of a VCO control word). However, any suitable number of bits may be used. In other embodiments, controllable oscillators other than VCOs, e.g., ring oscillators, may be used. One or more of the oscillator control signals used to adjust the oscillators may be used to adjust the tail current.

Figure 10:
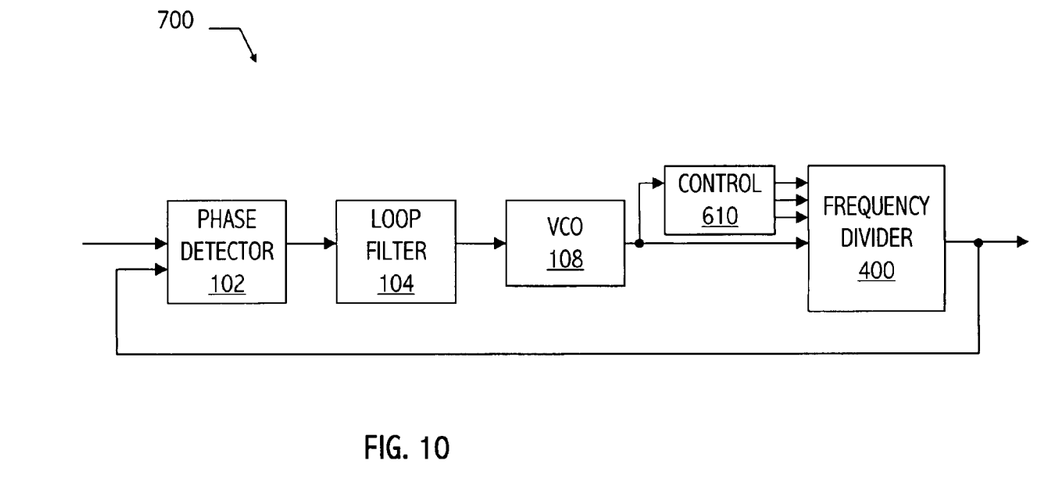
FIG. 10 is a block diagram illustrating a PLL circuit coupled to a frequency divider circuit responsive to a control block consistent with at least one embodiment of the present invention.
Figure 11:
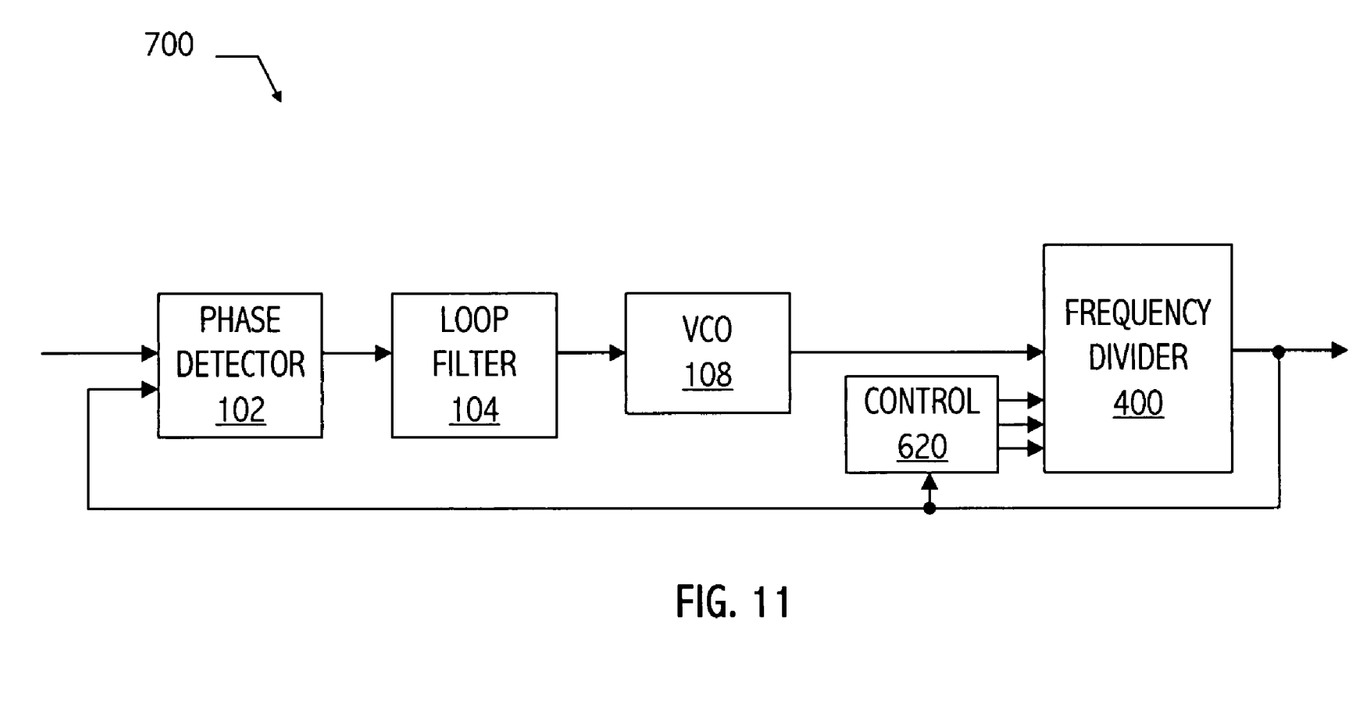
FIG. 11 is a block diagram illustrating a PLL circuit coupled to a frequency divider circuit responsive to a control block consistent with at least one embodiment of the present invention.

Referring to FIG. 10, in at least one embodiment of the invention, frequency divider 400 may be coupled to control circuit 610 and any suitable VCO (e.g., VCO 608 or VCO 108). Control circuit 610 determines the voltage swing of the VCO output and provides control bits to adjust the tail current(s) of frequency divider circuit 400. For example, control circuit 610 may include a peak detector circuit that receives and filters the output of the VCO to provide a DC output indicative of a minimum voltage output of the VCO. If the minimum voltage output of the VCO is below a particular voltage, control circuit 610 provides control bits to frequency divider 400 that select tail devices to boost the tail current of frequency divider 400 above a nominal value. In at least one embodiment of the invention, control circuit 620, which may include a peak detector circuit, provides control bits to adjust the tail current(s) of frequency divider circuit 400 according to the output voltage swing of frequency divider circuit 400 (FIG. 11).

The description of the invention set forth herein is illustrative and is not intended to limit the scope of the invention as set forth in the following claims. Although the invention is described with reference to a divide-by-two CML latch-based frequency divider, techniques described herein may be applied to other dividers (e.g., injection-locked frequency dividers or regenerative frequency dividers) and other divider ratios, and/or other buffers that receive a narrowband signal having a widely varying center frequency provided that a reference is available to indicate an approximate value for the center frequency (e.g., for tunable VCOs). In addition, since the natural frequency of frequency divider circuit 400 is dependent on the load resistance, the reference information may be used to vary load resistance of the CML buffer. Furthermore, variations and modifications of the embodiments disclosed herein may be made based on the foregoing description without departing from the scope and spirit of the invention as set forth in the following claims.

What is claimed is:

1. A differential divider circuit comprising:
    at least one common node coupled to at least one tail current path in the differential divider circuit;
    at least one differential pair of devices coupled to receive a differential input signal and coupled to the common node; and
    wherein a tail current through the common node is selectively adjusted according to a control signal, the tail current adjusting a natural frequency of oscillation of the differential divider circuit;
    wherein the differential input signal is based, at least in part, on an output of a controllable oscillator circuit; and
    wherein the control signal is based on at least one control signal coupled to tune the controllable oscillator circuit.

2. The differential divider circuit, as recited in claim 1, further comprising:
    at least one selectively enabled tail current path coupled between a supply voltage and the common node, the selectively enabled tail current path being coupled to receive the control signal.

3. The differential divider circuit, as recited in claim 1, wherein an output of the differential divider circuit has a frequency of one half of a frequency of the differential input signal.

4. The differential divider circuit as recited in claim 1 comprising:
    a first current mode logic latch coupled to receive the differential input signal;
    a second current mode logic latch coupled to receive the differential input signal and coupled to receive an output of the first current mode logic latch and coupled to provide an output to the first current mode logic latch, the output of the second current mode logic latch having a frequency of the differential input signal divided by a predetermined value; and
    wherein at least one of the first current mode logic latch and the second current mode logic latch comprises the differential pair of devices, the common node, and the tail current path.

5. The differential divider circuit, as recited in claim 1, wherein the controllable oscillator circuit is a voltage controlled oscillator circuit.

6. The differential divider circuit, as recited in claim 1, wherein the control signal is based on at least one control signal coupled to control a varactor in the controllable oscillator circuit.

7. The differential divider circuit, as recited in claim 2, further comprising additional tail current paths coupled to the common node and coupled to receive additional control signals wherein the common node is coupled to receive a current varying according to a non-linear function of oscillator voltage control bits.

8. The differential divider circuit, as recited in claim 1, wherein the differential input signal is received from the controllable oscillator circuit and the control signal is based, at least in part, on a voltage of the differential input signal.

9. The differential divider circuit, as recited in claim 1, further comprising:
    the controllable oscillator circuit coupled to provide the differential input signal.

10. The differential divider circuit, as recited in claim 1, wherein the at least one control signal includes at least a most significant bit of a digital control word comprising a plurality of control signals.

11. A differential divider circuit comprising:
   at least one common node coupled to at least one tail current path in the differential divider circuit;
   at least one differential pair of devices coupled to receive a differential input signal and coupled to the common node; and
   a peak detection circuit coupled to provide the control signal based, at least in part, on an output of the differential divider circuit, and
   wherein a tail current through the common node is selectively adjusted according to a control signal, the tail current adjusting a natural frequency of oscillation of the differential divider circuit;
   wherein the differential input signal is based, at least in part, on an output of a controllable oscillator circuit.

12. The differential divider circuit, as recited in claim 11, wherein the control signal is based on at least one control signal coupled to tune the controllable oscillator circuit.

13. The differential divider circuit, as recited in claim 12, wherein the at least one control signal includes at least a most significant bit of a digital control word comprising a plurality of control signals.

14. The differential divider circuit, as recited in claim 11, further comprising:
   at least one selectively enabled tail current path coupled between a supply voltage and the common node, the selectively enabled tail current path being coupled to receive the control signal.

15. The differential divider circuit, as recited in claim 14, further comprising:
   additional tail current paths coupled to the common node and coupled to receive additional control signals wherein the common node is coupled to receive a current varying according to a non-linear function of oscillator voltage control bits.

16. A method comprising:
   selectively adjusting at least one tail current of a frequency divider circuit according to a control signal, thereby adjusting a locking range of the frequency divider circuit,
   wherein the control signal is based, at least in part, on at least one control signal coupled to tune a controllable oscillator circuit.

17. The method, as recited in claim 16, wherein the selective tail current adjustments adjust the frequency of self oscillation of the frequency divider circuit.

18. The method, as recited in claim 16, further comprising:
   wherein the input to the frequency divider circuit is provided by the controllable oscillator circuit.

19. The method, as recited in claim 16, wherein the selective adjustment occurs during frequency acquisition of a phase-locked loop including the frequency divider circuit.

20. The method, as recited in claim 19, wherein a frequency of the input to the frequency divider circuit substantially exceeds a lock frequency of the frequency divider circuit during the frequency acquisition of the phase-locked loop.

21. The method, as recited in claim 16, wherein a voltage swing of the input of the frequency divider circuit is insufficient to lock a frequency of an output of the frequency divider circuit to half of the input frequency with a nominal tail current of the frequency divider circuit.

22. The method, as recited in claim 16, wherein the selective adjustment increases a voltage swing of an output of the frequency divider circuit from the voltage swing of the output of the frequency divider circuit with a nominal tail current.

23. The method, as recited in claim 16, wherein the at least one control signal includes at least a most significant bit of a digital control word comprising a plurality of control signals.

24. A method comprising:
   selectively adjusting at least one tail current of a frequency divider circuit according to a control signal, thereby adjusting a locking range of the frequency divider circuit; and
   detecting peaks in a voltage swing of an output of the frequency divider circuit and setting the control signal accordingly.

25. An apparatus comprising:
   means for dividing a frequency of an input clock signal having a range of operation;
   means for selectively adjusting the range of operation of the frequency dividing means by adjusting a tail current of the frequency dividing means; and
   means for controlling the means for selectively adjusting based, at least in part, on a frequency of the input clock signal,
   wherein the means for controlling comprises at least a portion of a control signal for tuning a controllable oscillator circuit of a phase-locked loop (PLL) including the means for dividing.

* * * * *